US012015036B2

(12) United States Patent
Hall et al.

(10) Patent No.: US 12,015,036 B2
(45) Date of Patent: Jun. 18, 2024

(54) HIGH TEMPORAL RESOLUTION SOLID-STATE X-RAY DETECTION SYSTEM

(71) Applicants: Lawrence Livermore National Security, LLC, Livermore, CA (US); The Regents of the University of California, Oakland, CA (US)

(72) Inventors: David Lawrence Hall, San Ramon, CA (US); Mihail Bora, Livermore, CA (US); Adam Conway, Livermore, CA (US); Philip Datte, Concord, CA (US); Qinghui Shao, Fremont, CA (US); Erik Lars Swanberg, Jr., Livermore, CA (US); Clement Antoine Trosseille, San Ramon, CA (US); Charles Edward Hunt, Davis, CA (US)

(73) Assignees: Lawrence Livermore National Security, LLC, Livermore, CA (US); The Regents of the University of California, Oakland, CA (US)

( * ) Notice: Subject to any disclaimer, the term of this patent is extended or adjusted under 35 U.S.C. 154(b) by 326 days.

(21) Appl. No.: 17/241,594

(22) Filed: Apr. 27, 2021

(65) Prior Publication Data
US 2021/0335866 A1 Oct. 28, 2021

Related U.S. Application Data

(60) Provisional application No. 63/016,965, filed on Apr. 28, 2020.

(51) Int. Cl.
*H01L 27/146* (2006.01)
*G01N 23/083* (2018.01)
*H01L 21/66* (2006.01)

(52) U.S. Cl.
CPC ..... *H01L 27/14603* (2013.01); *G01N 23/083* (2013.01); *H01L 22/12* (2013.01)

(58) Field of Classification Search
CPC ............... H01L 27/14603; H01L 22/12; H01L 27/14658; H01L 27/14659;
(Continued)

(56) References Cited

U.S. PATENT DOCUMENTS 4,885,620 A * 12/1989 Kemmer ............. H01L 31/1133
257/E27.15
4,937,453 A * 6/1990 Nelson ................... G01T 1/242
378/146

(Continued)

OTHER PUBLICATIONS

Castoldi, A., et al., "A new silicon drift detector with reduced lateral diffusion", NIM A377 (1996) pp. 375-380, 1996.
(Continued)

*Primary Examiner* — Eduardo A Rodela
(74) *Attorney, Agent, or Firm* — Perkins Coie, LLP

(57) ABSTRACT

Devices, systems and methods for solid-state X-ray detection with high temporal resolution are described. An example method includes receiving an X-ray pulse in a semiconductor chip resulting in an electron cloud being formed in the semiconductor chip, applying a first set of voltages across a first plurality of drift cathode strips on a first side of the semiconductor chip and a second plurality of drift cathode strips on a second side of the semiconductor chip, applying a second set of voltages to across the first and the second plurality of drift cathode strips to form an electric field having a linear profile to cause the electron cloud to drift along the middle of the semiconductor chip, and activating a counter cathode on the second side and one or more readout anodes on the first side to collect the electron cloud after spreading in the middle section of the semiconductor chip.

17 Claims, 16 Drawing Sheets

(58) Field of Classification Search
CPC ............ H01L 27/14676; H01L 31/085; H01L 31/115; H01L 31/117; H01L 31/1175; H01L 31/118; H01L 31/1185; H01L 31/119; G01N 23/083
See application file for complete search history.

(56) References Cited

U.S. PATENT DOCUMENTS

| | | | | |
|---|---|---|---|---|
| 5,051,801 | A * | 9/1991 | Van Eijk | H01L 31/115 257/E31.09 |
| 5,587,611 | A * | 12/1996 | Botka | H01L 31/1055 257/446 |
| 6,249,033 | B1 * | 6/2001 | Castoldi | H01L 27/14658 257/461 |
| 6,995,444 | B2 * | 2/2006 | Cova | H01L 31/02024 257/481 |
| 7,968,959 | B2 * | 6/2011 | Christophersen | H01L 31/1804 257/622 |
| 8,049,171 | B2 * | 11/2011 | Robbins | H01L 27/1485 250/336.1 |
| 8,314,468 | B2 * | 11/2012 | Hullinger | H01L 31/115 257/E31.086 |
| 8,421,172 | B2 * | 4/2013 | Morichi | G01T 1/2928 438/57 |
| 8,648,313 | B2 * | 2/2014 | Watanabe | H01J 37/244 250/370.06 |
| 9,383,452 | B2 * | 7/2016 | Li | G01T 1/02 |
| 9,484,472 | B2 * | 11/2016 | Kasai | H01L 27/14636 |
| 9,547,089 | B2 * | 1/2017 | Elin | H01L 31/028 |
| 10,074,685 | B1 * | 9/2018 | Bakowski Holtryd | H01L 27/1463 |
| 2006/0125038 | A1 * | 6/2006 | Mabuchi | H01L 27/14643 257/447 |
| 2012/0086079 | A1 * | 4/2012 | Kasai | H01L 27/14607 257/431 |
| 2012/0104523 | A1 * | 5/2012 | Ikeda | H01L 27/14623 257/E31.127 |

OTHER PUBLICATIONS

Castoldi, A., et al., "The Controlled-drift Detector", Nuclear Instruments and Methods, in Physics Research A 439 (200) 519-528.
Gatti, E., et al., "Semiconductor Drift Chamber—An Application of a Novel Charge Transport Scheme", Nuclear Instruments and Methods in Physics Research 225 (1984) pp. 608-614.
Gatti, E., et al., "The concept of the Solid State Drift Chamber", Proc. 1983 DPF Workshop on Collider Detectors, Feb. 28-Mar. 4, 1983, UC-37, CONF-830224, Report, LBL-15973, pp. 97-98.
Rehak, P., et al., "Semiconductor Drift Chambers for Position and Energy Measurements," NIM A235 (1985) pp. 224-234.
Rehak, P., et al., "State of the Art in Semiconductor Detectors", NIM A289 (1990) 410-417.
Zaima, S., et al., "Growth and applications of GeSn-related group-IV semiconductor materials", Science Technology of advance materials, vol. 16, Issue 4, 2015, 043502, pp. 1-22.

* cited by examiner

US 12,015,036 B2

HIGH TEMPORAL RESOLUTION SOLID-STATE X-RAY DETECTION SYSTEM

CROSS-REFERENCE TO RELATED APPLICATION

This patent document claims priority to and benefit of U.S. Provisional Patent Application No. 63/016,965 filed on Apr. 28, 2020. The entire content of the before-mentioned patent application is incorporated by reference as part of the disclosure of this patent document.

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This patent document is directed generally to optical imaging, and more particularly, solid-state X-ray pulse detection with high temporal resolution.

BACKGROUND

Solid-state X-ray detection systems can be implemented using a photo-diode array or a charge-coupled device, and enable precise positioning information as well as integration with digital processing systems. Solid-state detectors are also appealing due to scalability in size and cost, and compatibility with mature complementary metal-oxide-semiconductor (CMOS) technology. There is a need for solid-state X-ray detection systems that support both spatial resolution and temporal resolution.

SUMMARY

Embodiments of the disclosed technology relate to methods, devices and systems for solid-state X-ray detection with high temporal resolution. The disclosed embodiments can be used in many fields such as plasma physics, high-energy density physics, and life sciences that utilize or can benefit from high temporal resolution characterization of single (or discrete) events and stochastic processes.

The disclosed embodiments include an apparatus and method for solid-state X-ray pulse detection with high temporal resolution. In an example aspect, a method for solid-state X-ray pulse detection with high temporal resolution includes receiving an X-ray pulse in a semiconductor chip comprising a bulk material resulting in an electron cloud being formed in the semiconductor chip, applying a first set of voltages across a first plurality of drift cathode strips on a first side of the semiconductor chip and a second plurality of drift cathode strips on a second side of the semiconductor chip, wherein each of the first plurality and the second plurality of drift cathode strips are doped with a p-type dopant, and wherein setting the first set of voltages causes the electron cloud to migrate to a middle section of the semiconductor chip, applying a second set of voltages to across the first and the second plurality of drift cathode strips to form an electric field having a linear profile to cause the electron cloud to drift along the middle of the semiconductor chip, and activating a counter cathode on the second side and one or more readout anodes on the first side to collect the electron cloud after spreading in the middle section of the semiconductor chip, wherein each of the readout anodes is doped with an n-type dopant.

In another example aspect, a system for solid-state X-ray pulse detection with high temporal resolution includes a semiconductor chip comprising a bulk material, a first plurality of drift cathode strips on a first side of the semiconductor chip, a second plurality of drift cathode strips on a second side of the semiconductor chip, wherein each of the first plurality and the second plurality of drift cathode strips are doped with a p-type dopant, one or more readout anodes positioned on the first side, wherein each of the readout anodes is doped with an n-type dopant, and a counter cathode positioned on the second side, wherein the first plurality and the second plurality of drift cathode strips are configured to create a potential well in a middle section of the semiconductor chip and cause an electron cloud, generated by an X-ray pulse being incident on the semiconductor chip, to drift in a first direction towards the middle section of the semiconductor chip, wherein the first and the second plurality of drift cathodes are configured to further create a linearly graded potential along a length of the semiconductor chip and to cause the electron cloud to drift in a second direction that is substantially perpendicular to the first direction, and wherein the plurality of readout anodes are configured to collect the electron cloud after its spreading in the middle section of the semiconductor chip.

In yet another example aspect, a device chip for solid-state X-ray pulse detection includes a series of boron-doped drift cathode strips mirrored on a front and a back of the device chip, a column of phosphorus-doped readout anodes on the front of the device chip, and a boron-doped counter cathode on the back.

DETAILED DESCRIPTION

Figure 1:
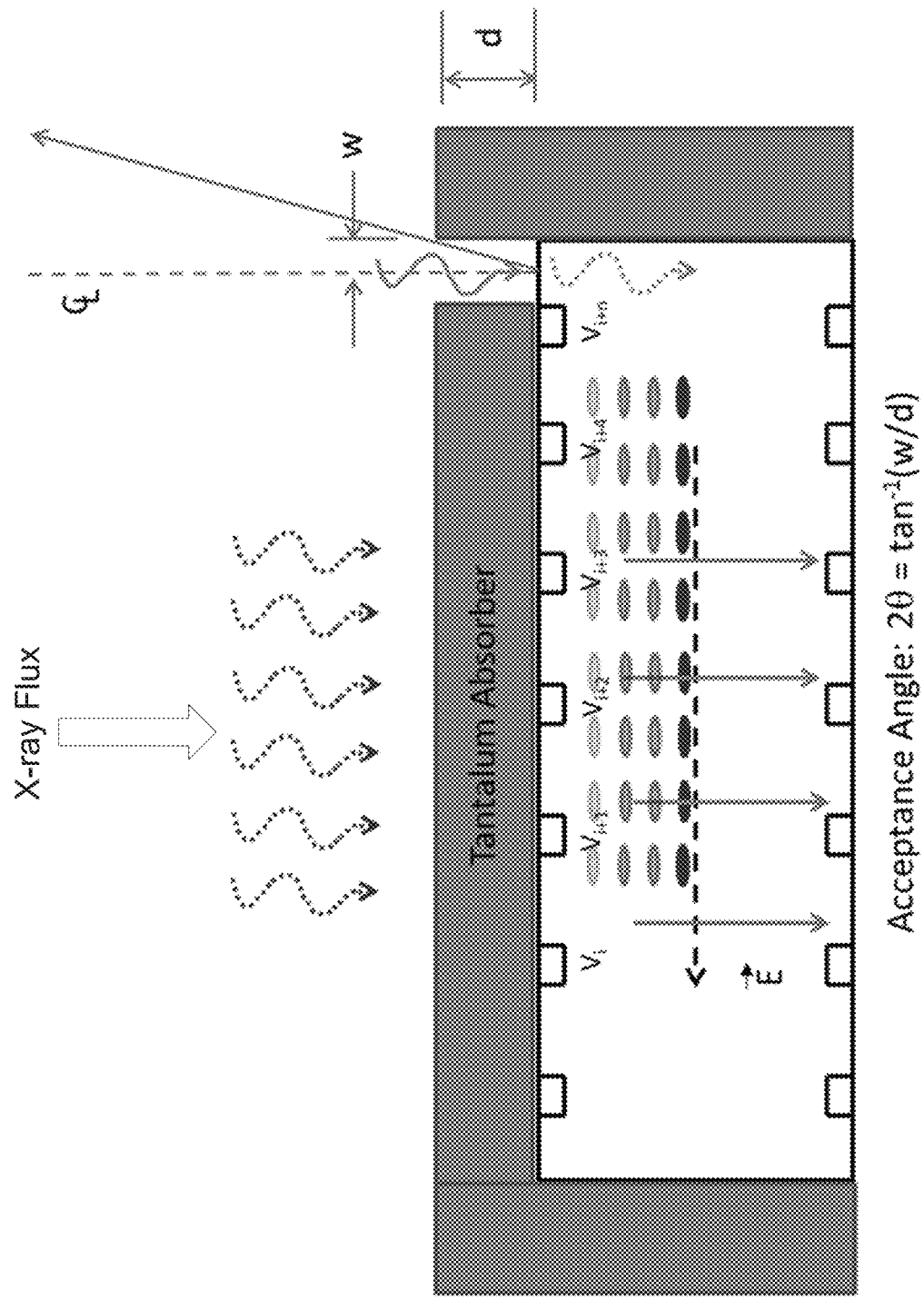
FIG. 1 is a two-dimensional schematic illustration of an example system for solid-state X-ray pulse detection with high temporal resolution.

Embodiments of the disclosed technology relate to the field of pulse detection (often referred to as sensing or imaging, or simply X-ray detection). Pulse detectors come in a variety of material classes and designs. In an example, solid-state detectors, such as a complementary metal-oxide-semiconductor (CMOS) and a charged-coupled device (CCD), offer spatial resolution down to about 10 μm to 100 μm, which is about as good as any other class of detector (or imager), but only offer temporal resolution in the millisecond range. Solid-state detectors are also appealing due to scalability in size and cost, and compatibility with mature CMOS technology. Streak cameras based on vacuum tubes offer the utmost in temporal resolution, down to 100 fs to 10 ps, without considering any application-specific limitations. In practice, the dynamic range and/or signal-to-noise ratio required by the applications results in lower temporal resolutions but, nonetheless, they are considered the choice for ultrafast detection and imaging. However, vacuum tube detectors typically offer 1-D acquisition, and spatial mapping is hence not straightforward. Also, vacuum tube type streak cameras suffer from large footprint and costly maintenance.

A streak detector, also referred to as an imager or a streak camera, is a high speed recording device that records electrons in time which are proportional to incoming photons, which can be thought of as an X-ray/optical oscilloscope. The existing technology of streak cameras is based on electron tubes that has been in operation for more than 30 years.

One current implementation of this legacy system includes a photocathode material (e.g., cesium iodide (CsI)), an electron tube, a microchannel plate, a phosphor plate and a scientific grade CCD camera. In support of this hardware, there are several complex pulsed and DC high voltage (−15 kV max) power supplies that are required for operation. The typical cost for conventional X-ray streak camera is approximately $250,000/unit. The proper operation of the streak camera also requires an extensive calibration and the generation of software correction files before it can be implemented. The operational streak window ranges from a few nanoseconds to several tens of nanoseconds with typical time resolution of ~30 ps/pixel and a spatial range of nominally 17 mm aperture. The photocathode material (CsI) is used for the measurement band of 500 eV to 6 keV with an average conversion of one electron per X-ray photon, peaking at 1 keV.

The embodiments described in this patent document advance solid-state pulse detection technology into the 10 ps temporal resolution range to offer more flexibility and options for ultrafast detection and imaging which is currently dominated by vacuum tubes. That is, the disclosed embodiments provide a low-cost, scalable alternative to vacuum tube streak cameras in a solid-state device.

In some embodiments, the solid-state X-ray pulse detector design is based on the architecture of the silicon drift detector (SDD), which uses a series of cathode strips on both sides of a silicon wafer to achieve bulk depletion and electron drift. Embodiments of the disclosed technology leverage the SDD functionality to achieve signal stretching of liberated charge carriers from incident X-ray photons. This process converts the time domain signals into the spatial domain, which is integral to achieving high temporal resolution in a solid-state device. While SDDs are traditionally used for energy resolution in particle counting experiments, the described embodiments seek to use SDD-based devices with transient bias profiles to achieve signal stretching with high temporal resolution capabilities.

In some embodiments, the described X-ray detection systems are implemented as a compact low-maintenance system, designed to operate over an X-ray range from 500 eV to ~70 keV, and leverage SSD technology designed with a large collection area with low equivalent capacitance that provides large area coverage and high energy resolution. This mature technology implements thick semiconductors (Si, Ge or others) and long drift distances. The voltage supplies are relatively low voltage ~300V max (typical). The spatial aperture (described below) can exceed over a centimeter depending on the desired design characteristics. The quantum efficiency for the semiconductors mentioned is considerably higher over the X-ray wavelength band and the photo conversion is ~3.6 (eV/e-h) for silicon.

FIG. 1 is a two-dimensional schematic illustration of an example system for solid-state X-ray pulse detection with high temporal resolution. As illustrated therein, the detector is configured such that a small active region is defined through proper X-ray shielding on one edge of the detector and using an opening, e.g., in the top right corner of a tantalum absorber. The aperture defines proper collumination for the incoming X-rays. The X-rays enter the detector and convert in the thickness of the semiconductor. The bulk of the semiconductor has a row of cathode strips above and below (denoted $C_{n-1}$, $C_n$ and $c_{n+1}$ in FIG. 2), with each cathode on the top (or front) surface, in this example configuration, sharing the same potential (denoted $V_i$ for the i-th cathode in FIG. 1) as the corresponding cathode on the bottom (or back) surface.

The detector has a bias field such that the liberated electrons (sometimes referred to as the electron cloud) drift in the horizontal direction. Once the charge is in the drift region, the horizontal drift field is turned off and a vertical field is applied. This causes the charge to move in the vertical direction until the charge is collected on the top electrodes of the detector. The collection region is pixelated in a manner that the size and spacing of the pixels define the temporal resolution. Embodiments of the described technology turn time information into physical space, wherein the ability to make feature sizes as small as possible define the temporal resolution limit.

Figure 2:
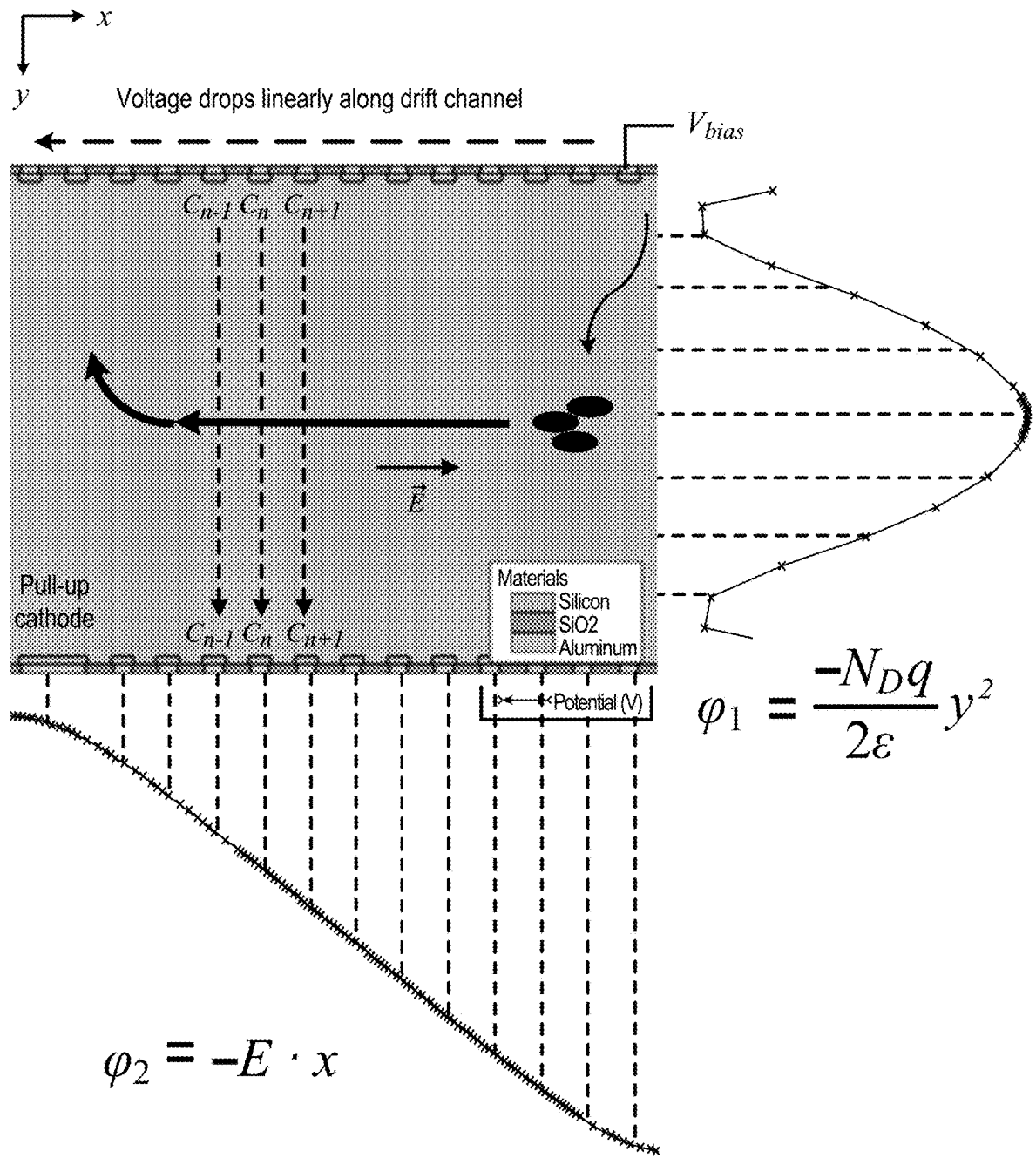
FIG. 2 illustrates voltage potentials for the example system for solid-state X-ray pulse detection with high temporal resolution from FIG. 1.
Figures 3A, 3B:
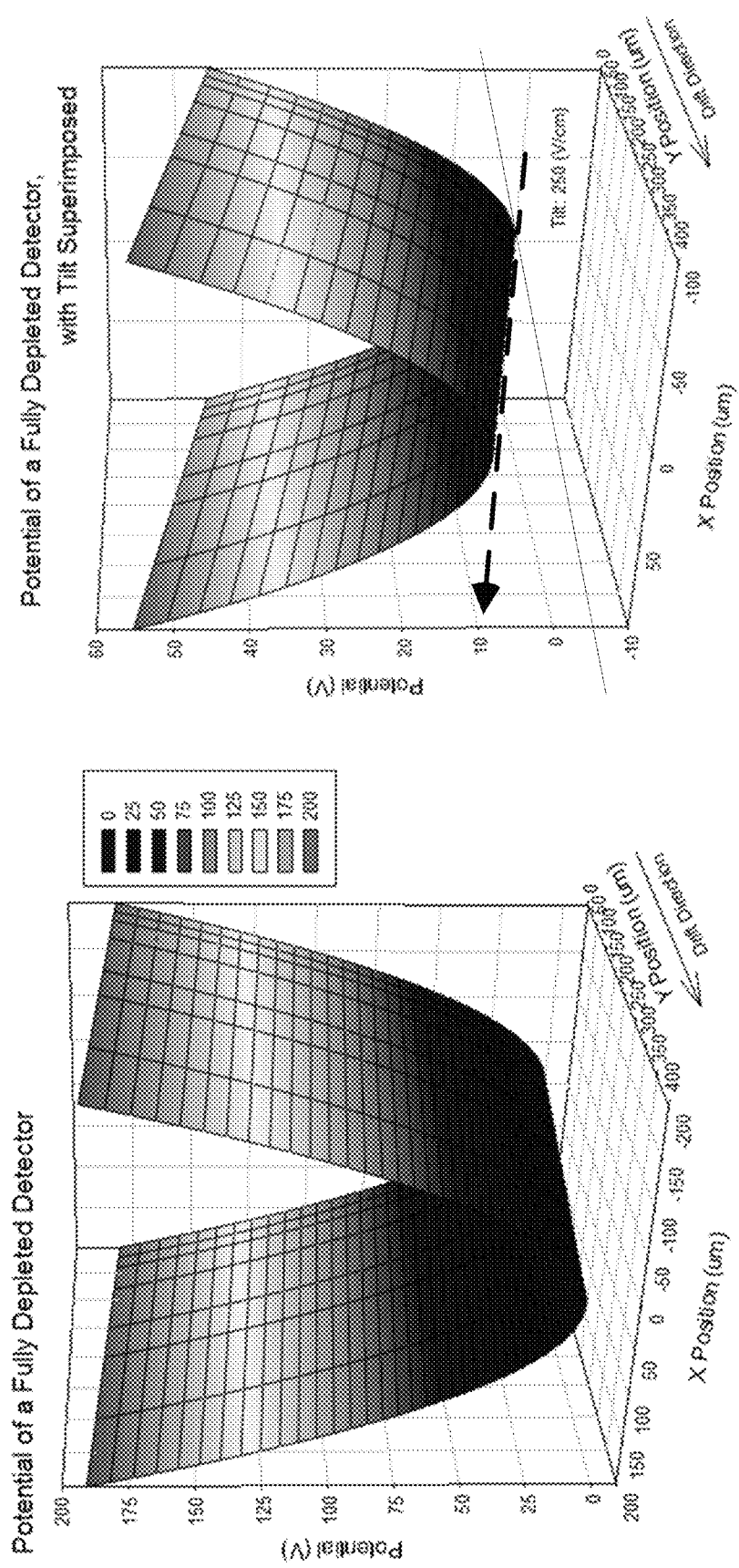
FIG. 3A illustrates an example parabolic shape of the voltage potential for the solid-state X-ray detector with high temporal resolution.
FIG. 3B illustrates the parabolic shape from FIG. 3A with a tilt voltage.

In some embodiments, the detector can be configured to be virtually insensitive to the X-ray energy of the incoming photon. This may be achieved by applying a field to an array of electrodes on both sides of the detector to produce a uniform drift field parallel to the surface of the wafer and to ensure complete depletion of the detector. This produces a parabolic potential shape such that the potential minimum is located in the center of the device (mid-plane), as illustrated in FIGS. 2 and 3A. All liberated charge, regardless of where it is generated in the detector (i.e., the bulk of the semiconductor chip), migrate to the center. For example, low energy X-ray photons are absorbed near the entrance surface and drift to the minimum potential region. Medium energy X-rays are absorbed in the central region of the detector and the charge is local to the minimum potential. High energy X-ray photons are absorbed in the farthest region from the entrance and the liberated charge drifts back towards the center to the minimum potential.

FIG. 3A illustrates an example of the parabolic potential plot modeled for the detector configuration. The potential minimum or "gutter" is located at the detector mid-plane (X=0 in FIG. 3A) when a symmetric voltage is applied and the liberated charges from an X-ray pulse migrate to this minimum. Without a DC bias to this potential, the charge would sit at this minimum and recombine over time. When the DC bias is applied, the parabolic potential gets a "tilt" (as illustrated in FIG. 3B) and this allows the charge to move towards the anode potential. The velocity of the charge (below saturation) is dependent on the strength of the bias. The application of a ramp to the bias puts dispersion on the charge with respect to incoming photons until saturation is reached. The ramp can either be positive or negative which causes the charge to speed up or slow down equating to manipulating the charge over time. Forcing the charge to spread out spatially through biasing techniques provides better time resolution on the collection electrodes.

Figure 4:
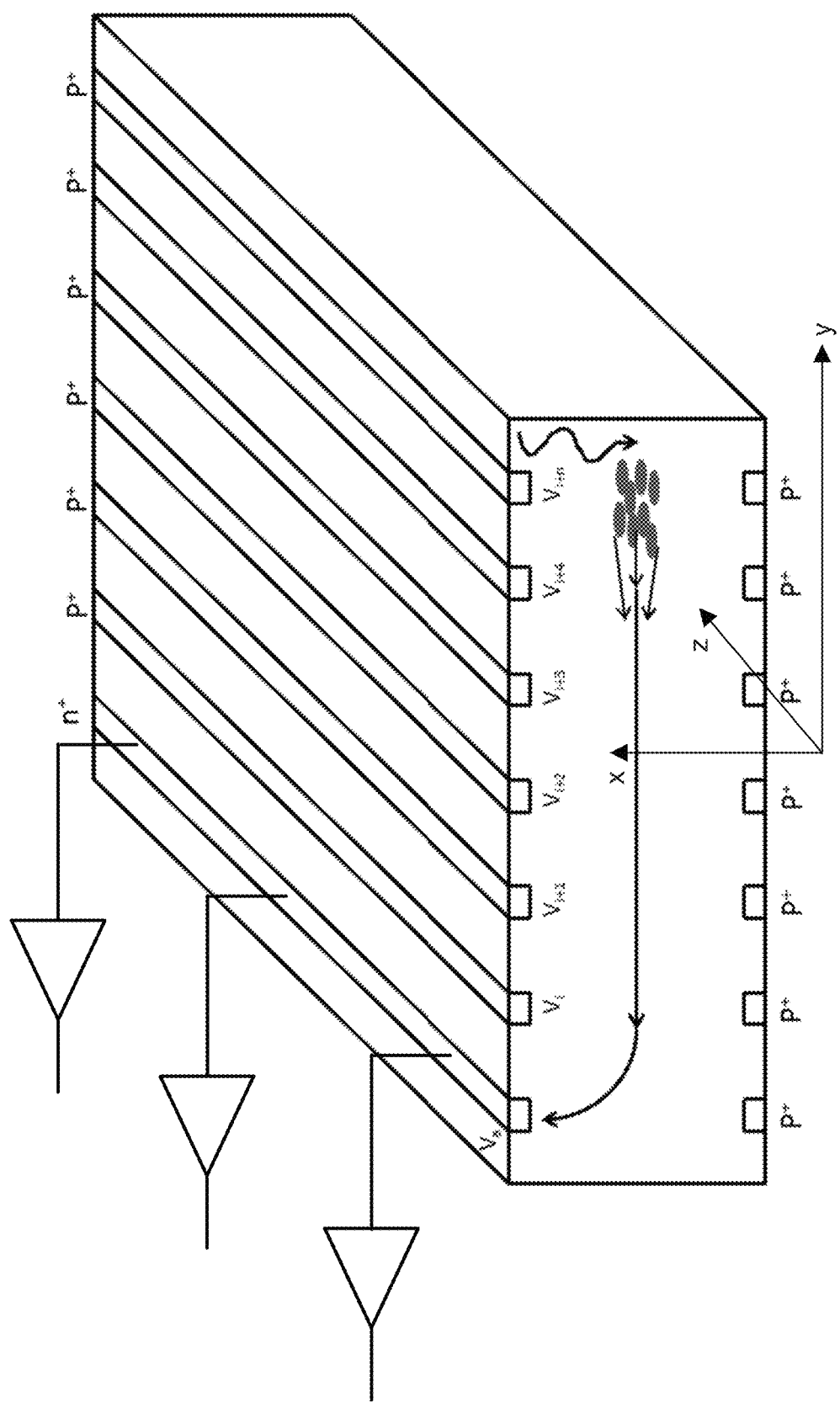
FIG. 4 illustrates a perspective view of a semiconductor drift detector.

FIG. 4 illustrates a perspective view of a semiconductor drift detector that can used in the disclosed detection systems in accordance with the embodiments of the disclosed technology. As illustrated therein, and described above, the volume of the detector is fully depleted of mobile electrons. The field created by the remaining fixed charges confines electrons generated by an ionizing particle in a buried potential channel. Then, an electrostatic field parallel to the surface is superimposed. This electrostatic field transports electrons created by a particle passage along the buried channel towards a collecting anode. The transit time of the electrons inside the detector measures the distance of an incident particle from the anode aperture.

The shape of the electric potential in the drift detector illustrated in FIG. 4 can be derived using Poisson's equation for potential energy, given as:

$$\Delta \varphi = \frac{-N_D q}{\epsilon}.$$

Herein, $\varphi$ is the potential, $N_D$ is the doping concentration (e.g., typically on the order or $10^{-11}$ or $10^{-12}$ cm$^{-3}$, such that lower doping results in higher drift mobility), $\epsilon$ is the dielectric constant and q is the charge. In an example, a solution to the equation can be found by constructing a potential $\varphi=(\varphi_1+\varphi_2)$, and noting that for Poisson's equation to be linear, $\varphi_2$ must satisfy Laplace's equation, i.e., $$\Delta\varphi_2=0.$$

Given this constraint, the following differential equation can be defined:

$$\frac{\partial^2 \varphi_1}{\partial x^2} = \frac{-N_D q}{\epsilon}.$$

The above differential equation has a solution:

$$\varphi_1 = \frac{-N_D q}{2\epsilon}(x-x_0)^2 + \varphi_0.$$

Herein, $x_0$ and $\varphi_0$ are integration constants. An exact solution of $x_0=\varphi_0=0$ defines a parabolic solution, and recombining $\varphi$ as the sum of $(\varphi_1+\varphi_2)$ results in:

$$\varphi_1 = \frac{-N_D q}{2\epsilon}(x)^2 \text{ and } \varphi_2 = -E \cdot y$$

$$\varphi = \frac{-N_D q}{2\epsilon}(x)^2 - E \cdot y$$

The above equation (with x specifying the vertical distance and y specifying the horizontal distance) describes the operational potential of the semiconductor drift chamber, wherein the first (parabolic) term defines the diode depletion region and the second (linear) term defines the "tilt" or drift velocity.

Figure 5A:
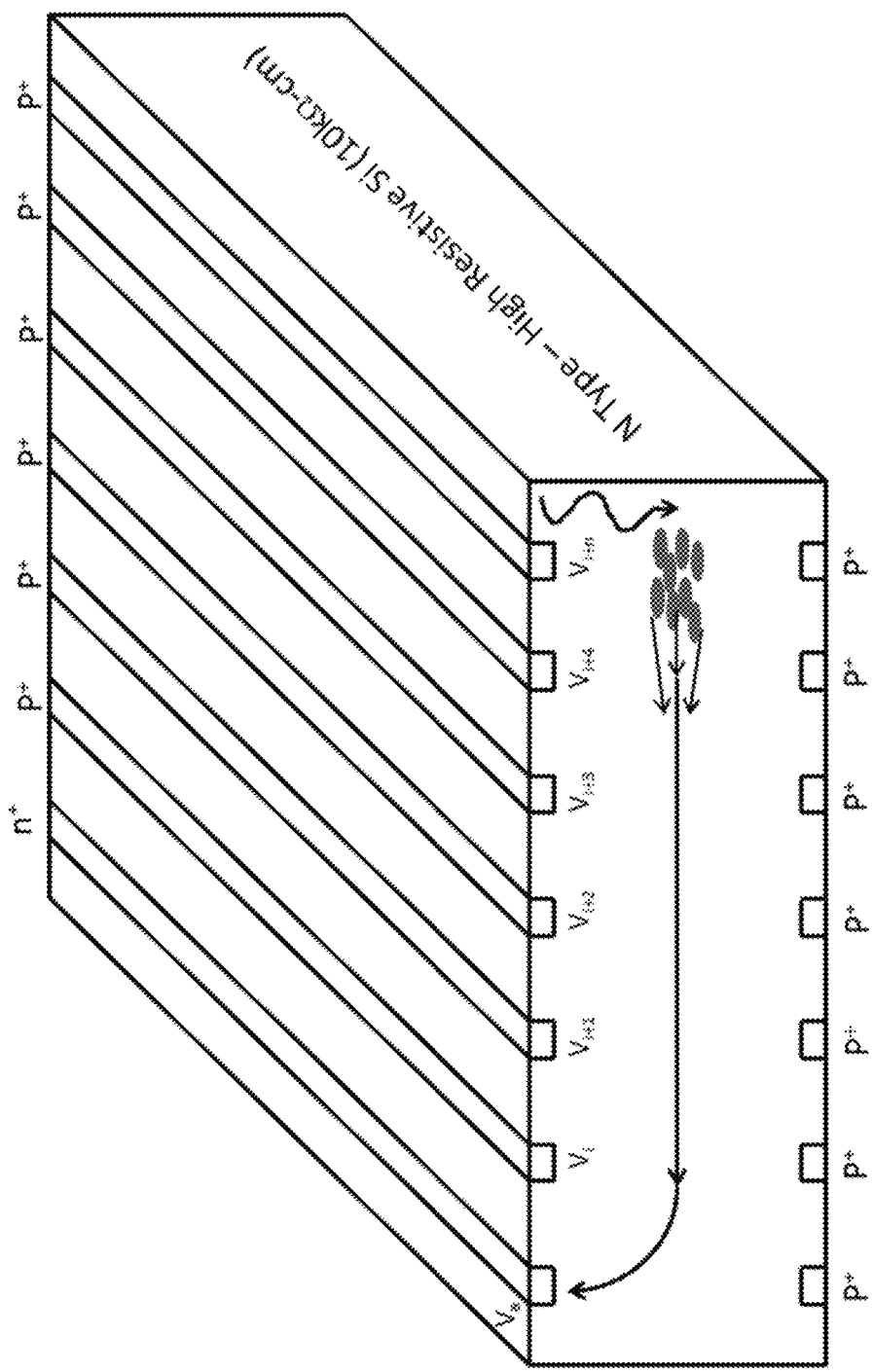
FIG. 5A illustrates a first state in an operation of an example solid-state X-ray detector.
Figure 5B:
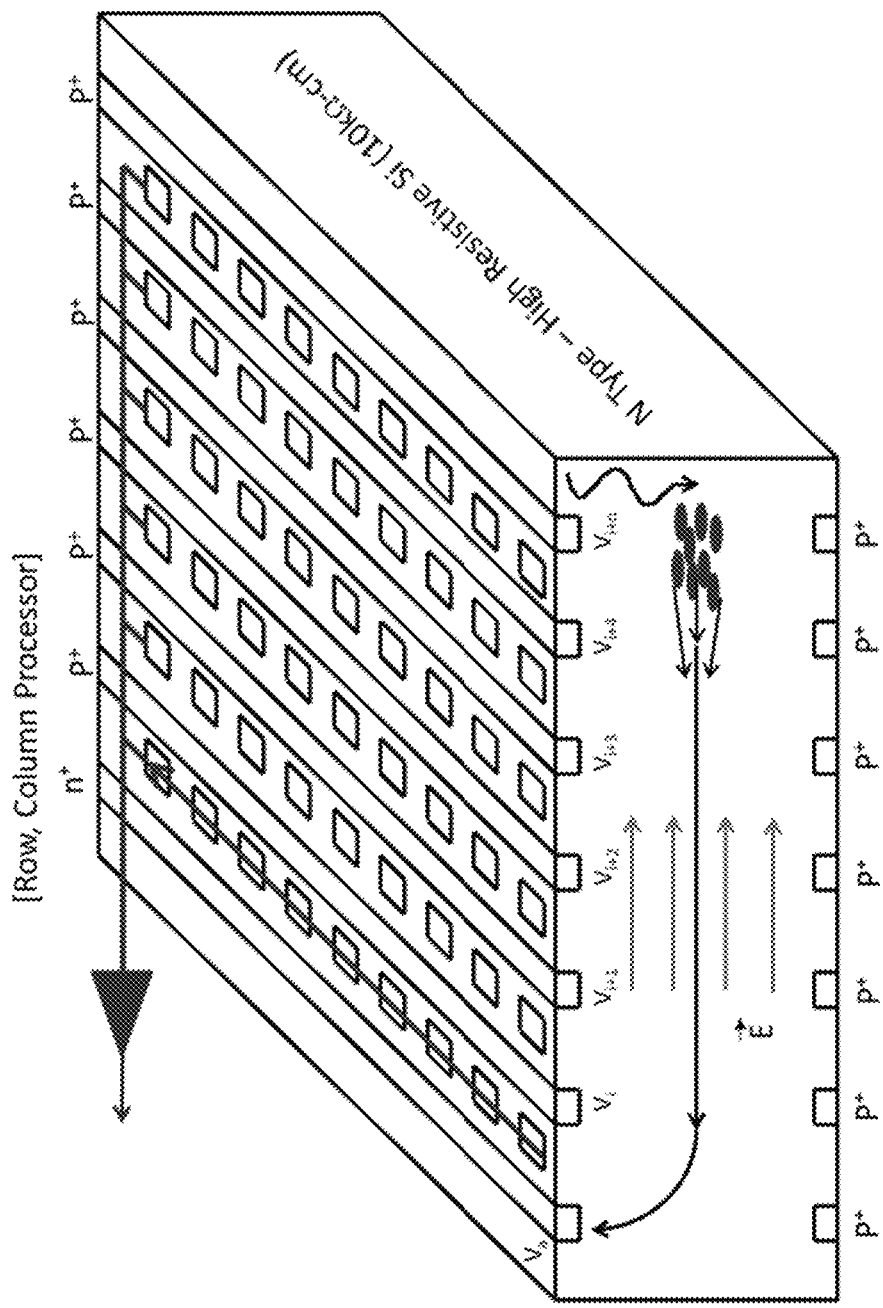
FIG. 5B illustrates a second state in an operation of the solid-state X-ray detector.
Figure 5C:
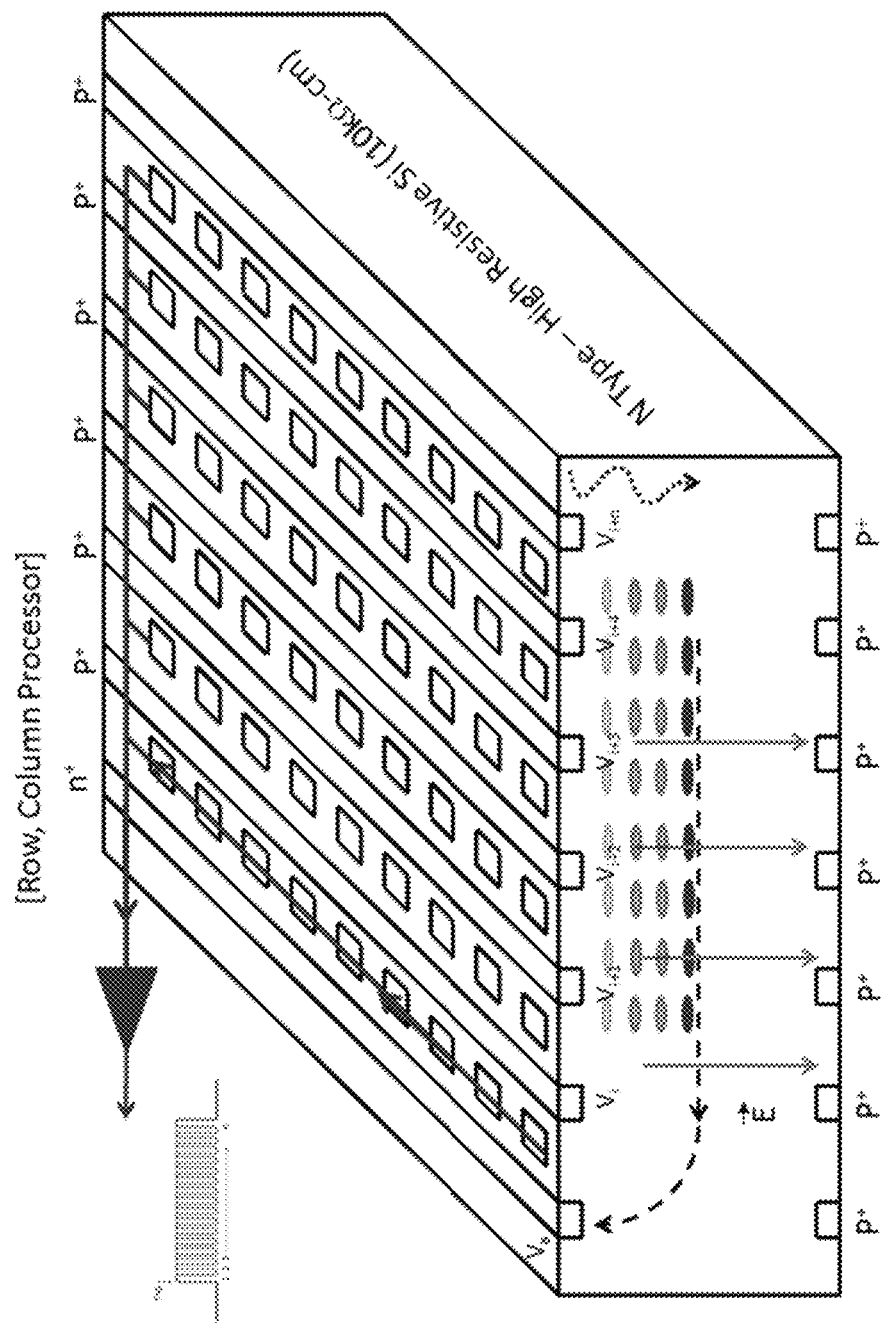
FIG. 5C illustrates a third state in an operation of the solid-state X-ray detector.
Figure 5D:
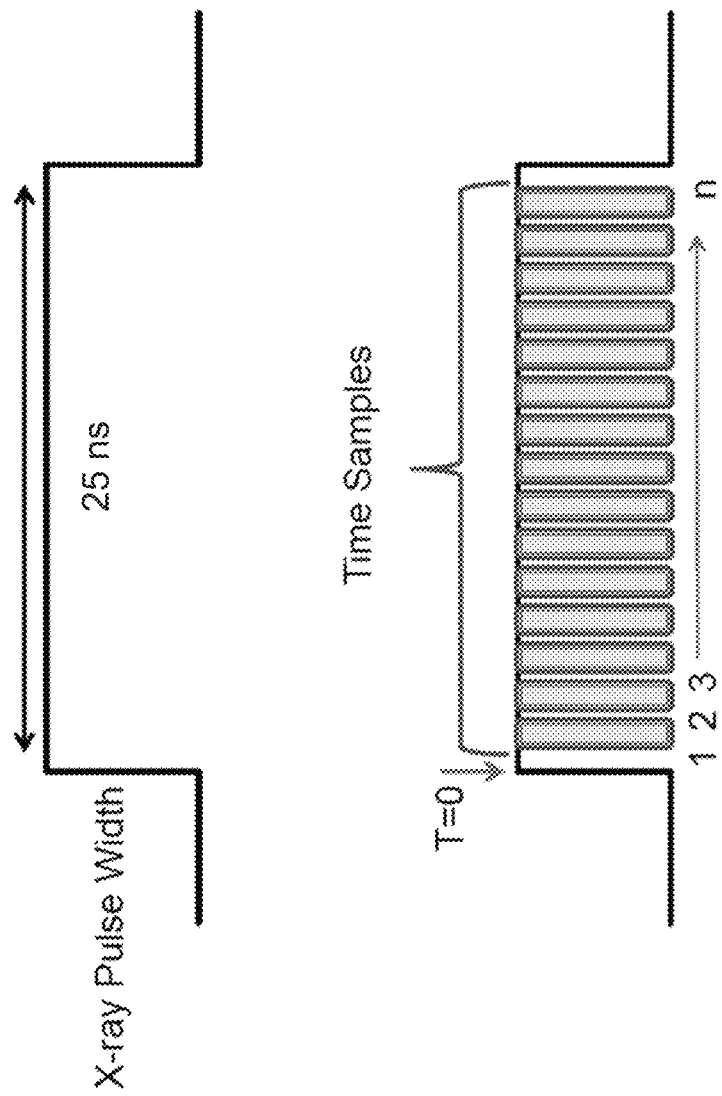
FIG. 5D illustrates the time-domain X-ray pulse and the time samples obtained based on the operation of the solid-state X-ray detector illustrated in FIGS. 5A-5C.

FIGS. 5A, 5B and 5C illustrate different states in the operation of the solid-state X-ray pulse detection with high temporal resolution, some of which have been previously discussed. FIG. 5D illustrates the input time-domain X-ray pulse and the resulting time samples that are obtained based on the operation of the solid-state X-ray detector, as illustrated in FIGS. 5A-5C.

As illustrated in FIG. 5A, the liberated charge is directed toward the center of the detector, which is a potential minimum (e.g., the "gutter" of the parabola as illustrated in FIGS. 2, 3A and 3B). The horizontal drift field directs the charge to the anode. FIG. 5B further illustrates the solid-state X-ray detector being configured with a grid of read-out anodes that are used to collect and measure the charge when the electron cloud is pushed up toward the strip of read-out anodes (e.g., using the "pull-up cathode" as illustrated in FIG. 2).

In some embodiments, the cathodes below any specific read-out anode strip can be configured, by changing its voltage, to push the electron cloud toward that specific read-out anode strip. While FIG. 5C shows a single collection anode, it is understood that additional readout anodes can be added to enable sampling of the electron cloud at multiple locations. This results in the generation of a high temporal resolution time-series based on the read-out anode strips. In some embodiments, the resolution of the output time-series depends on the number of cathode strips used in solid-state X-ray detector.

In contrast to existing systems, the systems that are implemented according to the embodiments of the disclosed technology are able to achieve a high temporal resolution by selecting the proper thickness of the wafer, the length of the drift region and the biasing of the device, among other variables. By leveraging solid-state drift detectors, which are typically employed in applications that require energy resolution, the optimization and selection of various parameters as used in the configurations disclosed herein, enable high temporal resolution characterization of single (or discrete) events and stochastic processes.

Figure 6:
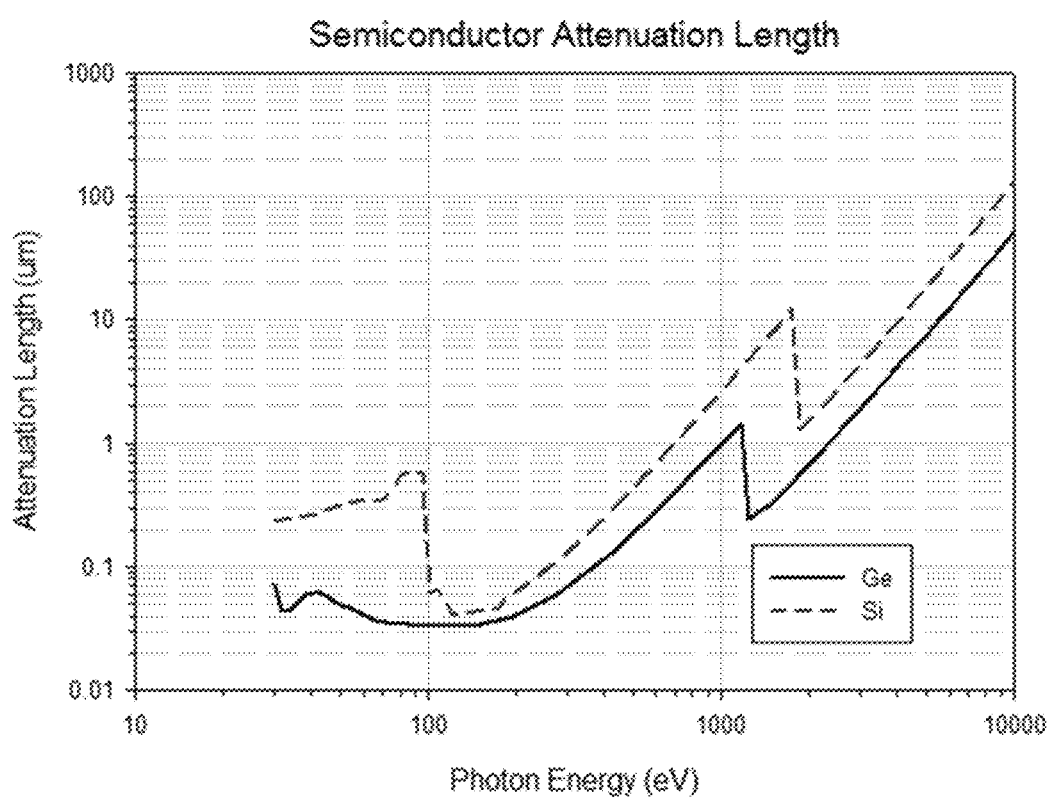
FIG. 6 plots the attenuation lengths (in μm) for silicon (Si) and germanium (Ge) as a function of X-ray energy (in eV).

FIG. 6 illustrates example plots of attenuation lengths (in µm) for silicon (Si) and germanium (Ge) as a function of X-ray energy (in eV). As illustrated therein, a proper thickness of the wafer (based on attenuation length) can be selected as a function of photon energy that is expected to be incident thereon. For example, to measure X-rays up to 10 keV, a detector thickness greater than 100 um would be required to absorb the incoming X-rays within one attenuation length (1/e or 63%). If the detector thickness were too thin, the X-rays would pass through without being absorbed, whereas if the detector thickness were too thick, the liberated charge in the detector would possibly recombine before getting collected on the detector collection electrode. FIG. 6 illustrates that either silicon or germanium may be used to implement the solid-state X-ray streak camera based on the photon energy range of interest.

Figure 7:
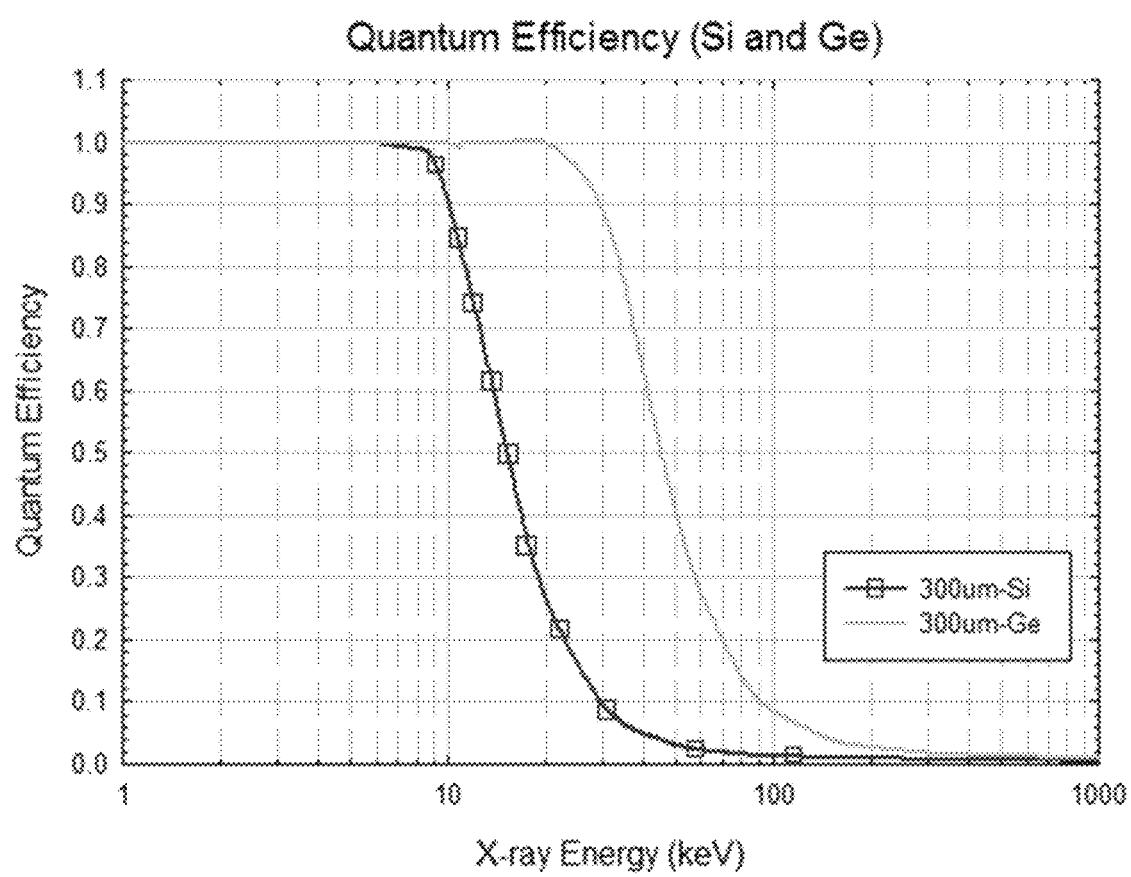
FIG. 7 plots the quantum efficiency for a 300 μm thick Si and Ge detector material as a function of X-ray energy.

FIG. 7 illustrates plots of quantum efficiency, defined as the ratio between the number of X-rays that get absorbed and recorded and the number of X-ray particles incident through the opening on the upper surface of the device, for Si and Ge as a function of X-ray energy. FIG. 7 illustrates silicon is approximately 100% efficient below 10 keV for the detector thickness of 300 µm. For higher energy X-rays, a germanium assembly can cover up to 70 keV at twenty percent efficiency. By increasing the detector thickness, higher energy X-ray detection can be achieved for both materials. There are several advantages to migrate to a thinner, higher efficiency detector. The main advantage is to reduce unwanted dispersion in the vertical drift field once the X-ray photon is converted to charge. As the detector becomes thicker, the dispersion increases in the horizontal direction when the charge is drifting in the vertical drift direction. The germanium detector is appealing to cover a higher x-ray range when compared to the equivalent thickness silicon for the same range of x-ray coverage in germanium.

In some embodiments, the electric field (the second linear term in the solution for $\varphi$) can be varied as a function of time. In this case, the operational potential of the semiconductor drift chamber can be expressed as:

$$\varphi = \frac{-N_D q}{2\epsilon}(x)^2 - E(t) \cdot y$$

Herein, $V(t) = E(t) \times l = (m^* t) + V_0$, wherein $m = dV/dt$ is the voltage ramp, l is the drift length, and t denotes the instantaneous temporal dispersion. This results in the following expression for the electron velocity:

$$v(t)_e = \mu_e E(t) = \mu_e \left[ \frac{m * t + V_0}{l} \right].$$

Herein, $\mu_e$ is the material's electron mobility, which is typically 1500 cm²/V-s for silicon and 3900 cm²/V-s for germanium.

Figure 8:
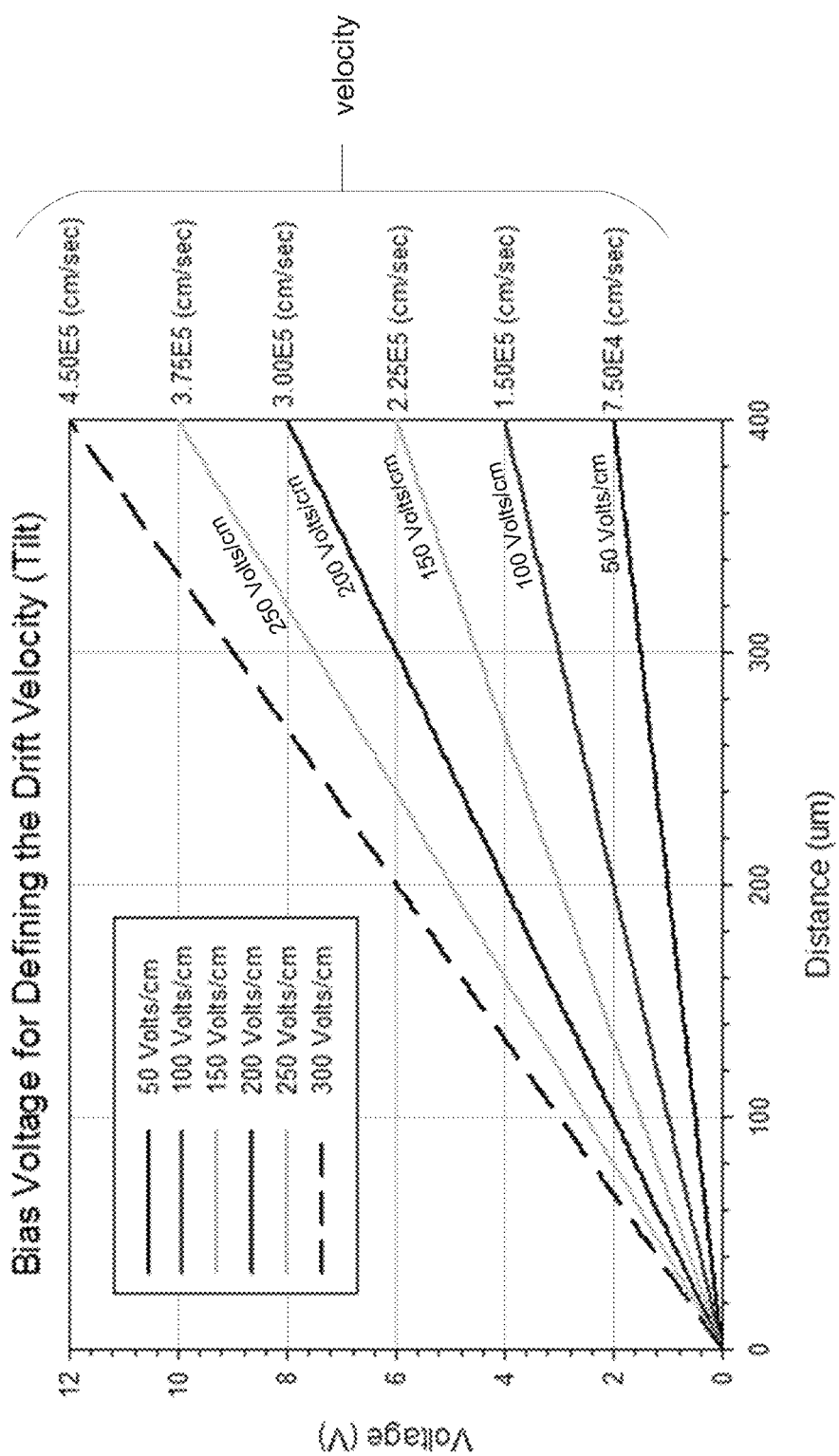
FIG. 8 plots the bias voltage as a function of distance within an example solid-state X-ray detector that defines the drift velocity of the electron cloud.

The drift velocity is a function of the electric field (until the saturation velocity is reached), and the ramp voltage changes the velocity of the liberated charge. FIG. 8 illustrates plots of electron velocity (on the right-hand y-axis) that is defined by the superposition of the linear potential on the parabolic potential. The electron velocity and the bias voltage (on the left-hand y-axis, in Volts) are plotted for varying electric field strengths (in Volts/cm) as a function of the drift length (in µm).

Figure 9:
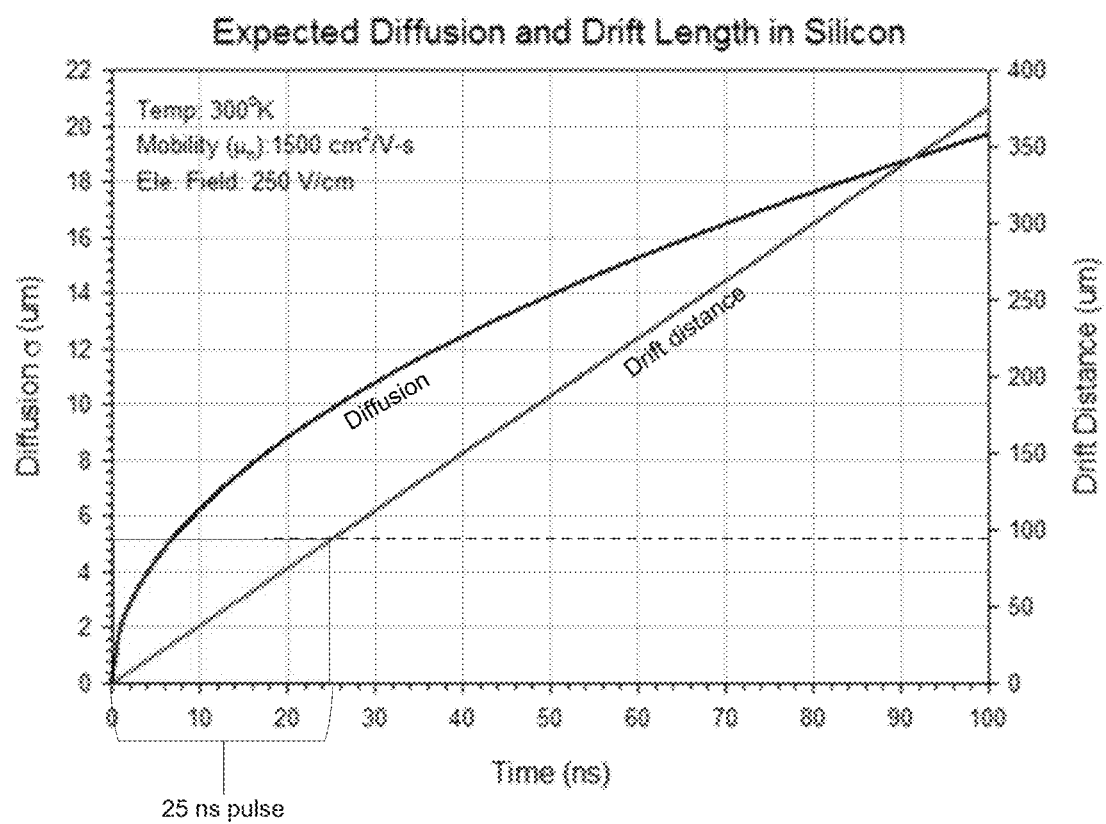
FIG. 9 plots the drift length and diffusion for silicon as a function of time for an example solid-state X-ray detector.

FIG. 9 illustrates plots of drift length and diffusion for silicon as a function of time for an example solid-state X-ray detector. In an example, as illustrated in FIG. 9, a typical pulse of 25 ns is equivalent to about 100-µm drift distance and experiences a 5-µm diffusion from the leading edge of the pulse to the trailing edge of the pulse. In another example, for a 300-µm thick detector, the drift distance is ½ the thickness (150 µm) and diffusion in the vertical direction is approximately 8 µm.

In some embodiments, the parameters discussed in the context of FIGS. 6-9 are selected and tuned to enable the solid-state X-ray detector to provide a desired high temporal resolution. In an example, the parameters may be optimized to configure a device to be capable of spreading a charge generated in a 25 ns X-ray pulse by 10× beyond the dispersion limit of electron saturation velocity in silicon, which is $10^7$ cm/s. In this case, a spatial resolution of 30 µm and a temporal resolution of 30 ps can be achieved.

In some embodiments, the solid-state X-ray detector comprises a 1.5 cm×1.0 cm die that includes a 1 cm long drift channel that acts as an "electron runway" to allow the required charge spreading. The die further includes a series of boron-doped drift cathode strips mirrored on the front and back of the device chip to achieve (i) bulk depletion to create a potential well for electrons, and (ii) a linearly graded potential to drift the electrons over a distance of 1 cm before being collected. In an example, 50 cathode strips can be used. In another example, 100 cathode strips in a double-sided architecture can be used. In other embodiments, any p-type dopant may be used for the drift cathode strips (instead of boron).

The example device includes a column of 10 phosphorus-doped readout anodes which collect charge after it has been spread. In some embodiments, any n-type dopant may be used for the readout anodes (instead of phosphorous). This example device includes a boron-doped counter cathode on the chip backside which pushes charge toward the readout anodes once the charge reaches the end of the drift channel.

The example device includes a phosphorus-doped guard ring which prevents stray leakage from outside the device active area from entering the drift channel, and a boron-doped guard strip on either end of the device active area which (i) prevents any electronic coupling between the guard ring and outermost drift cathode, and (ii) prevents leakage current being read by anode.

In some embodiments, a voltage divider network interfaced with drift cathodes may be used to linearly grade the potential along the drift channel. The detector is designed to have 10 M ohm between adjacent cathode strips when the bias between adjacent cathodes is 50 V. 1 M ohm resistors may be used between adjacent cathodes for the voltage divider network, which ensures that the majority of the current is flowing through the voltage divider network and not through the device. In some embodiments, charge integrating preamplifiers are used after the charge collection anodes.

Figure 10A:
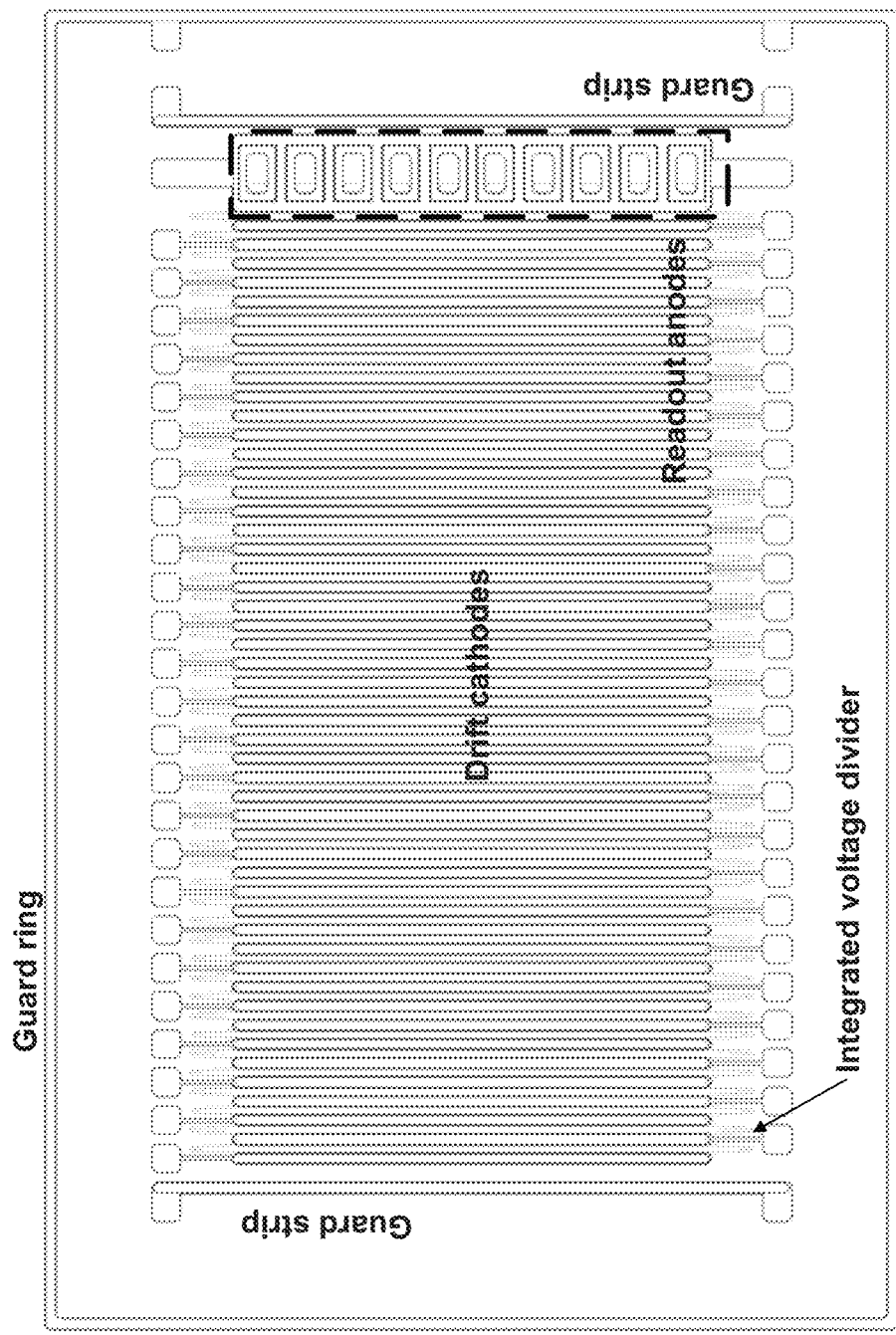
FIG. 10A illustrates an example architecture for a solid-state X-ray detector.
Figure 10B:
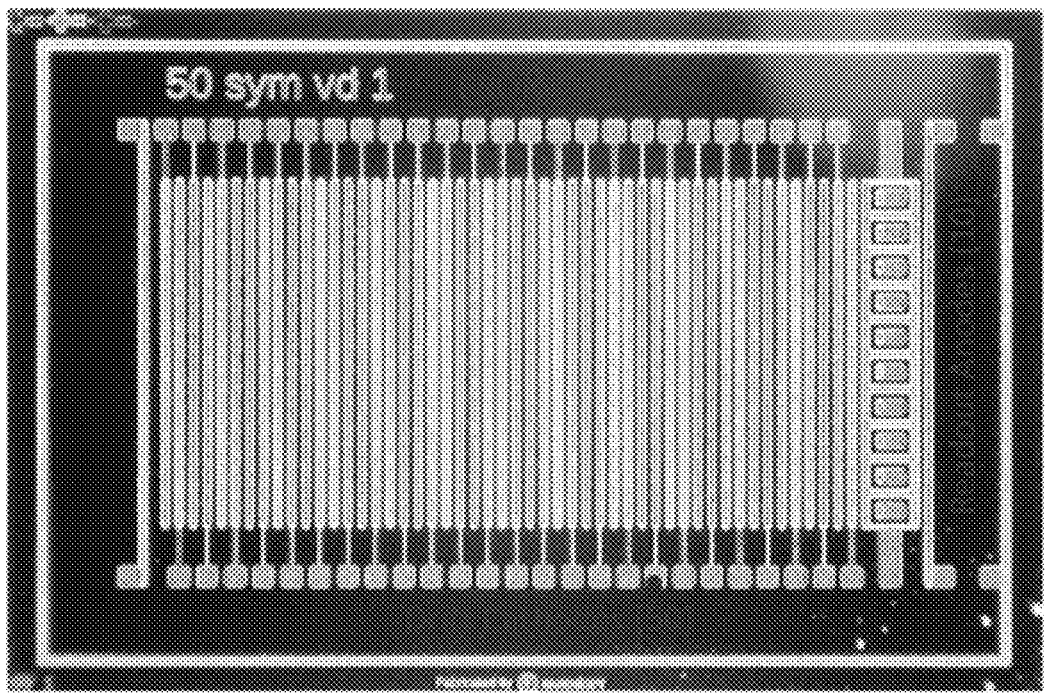
FIG. 10B illustrates a front-side of a double-sided detector architecture for a solid-state X-ray detector.
Figure 10C:
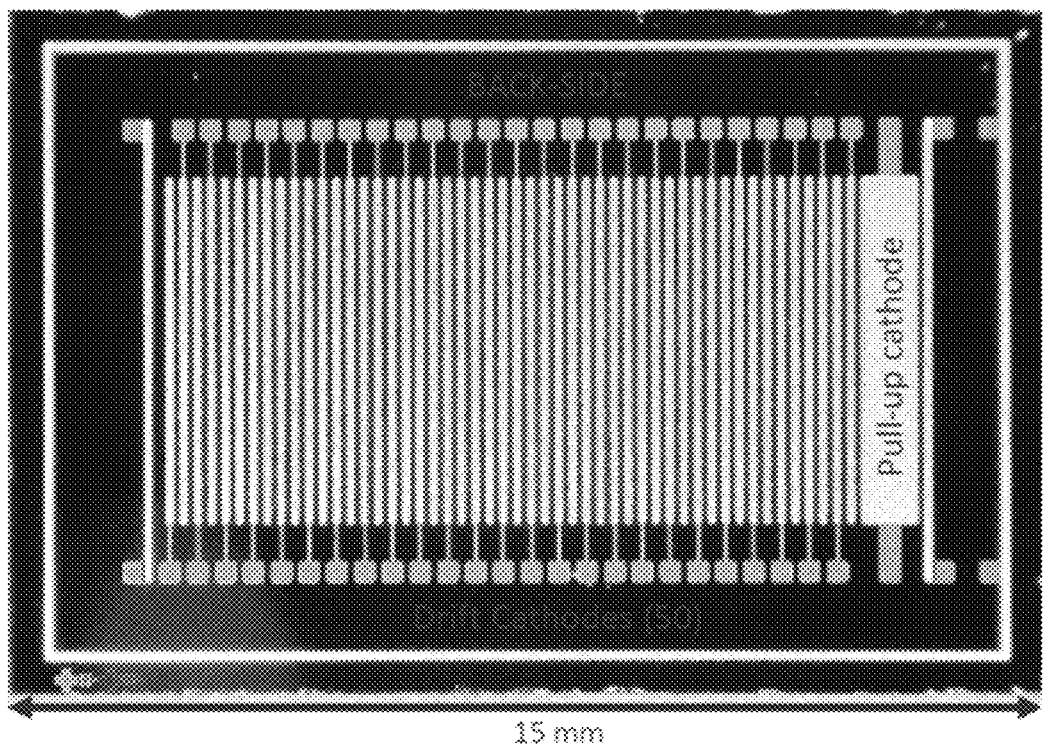
FIG. 10C illustrates a back-side of the solid-state X-ray detector in FIG. 10B.

FIG. 10A illustrates a top view of an example architecture for a solid-state X-ray detector. FIGS. 10B and 10C illustrate a front-side and a back-side of a double-sided detector architecture for another solid-state X-ray detector, respectively. As shown in these example architectures, and as discussed above, the drift cathodes are in between the readout anodes and guard strips, which prevent stray charges from interfering with the read-out anodes and the last cathode strip. Each of the drift cathodes may be coupled to an integrated voltage divider that can be used to configure the linear drop potential (and the voltage of the pull-up cathode) along the drift channel. The device is surrounded by a guard ring, which prevents outside charges from being collected.

In some embodiments, the readout anodes need not be confined to a single column as illustrated in FIG. 10, and an array (as illustrated in FIGS. 5B and 5C) can be employed. In this latter case, a column of readout anodes on the front surface may be activated after the voltage of the corresponding cathode on the back surface is changed to operate the cathode as a pull-up cathode. That is, the two sets of cathode strips may be first operated to propagate and spread the electron cloud through the potential well, and then each cathode strip and corresponding readout anode strip can be activated to pull up the electron cloud.

In an example, the architecture illustrated in FIGS. 10B and 10C is implemented with the following features, amongst other features:

- P-type cathodes underwent a boron implantation and N-type anodes underwent a phosphorous implantation, each with a 1e15 cm$^{-2}$ dose and 80 keV energy.
- An on-chip voltage divider network was designed as a serpentine structure and fabricated using a boron implantation 4e11 cm-2 dose and 80 keV energy. In some embodiments, the final module used to collect data may not use the on-chip voltage divider, but rather an external network of surface mount resistors.
- A polyimide passivation step is included for dielectric protection.
- The backside is flip-chip bonded using a eutectic AuSn layer onto a silicon chip that provides interconnection to the device backside.
- Wirebonding is performed to the frontside to (i) provide interconnection to the front cathodes, anodes, guard strips and guard ring, and (ii) connect each of the 50 cathodes on the front to its mirrored cathode on the back, as required for bulk depletion.
- PCB mounting and assembly to bias all device components and read out signal from anodes.

Figure 11:
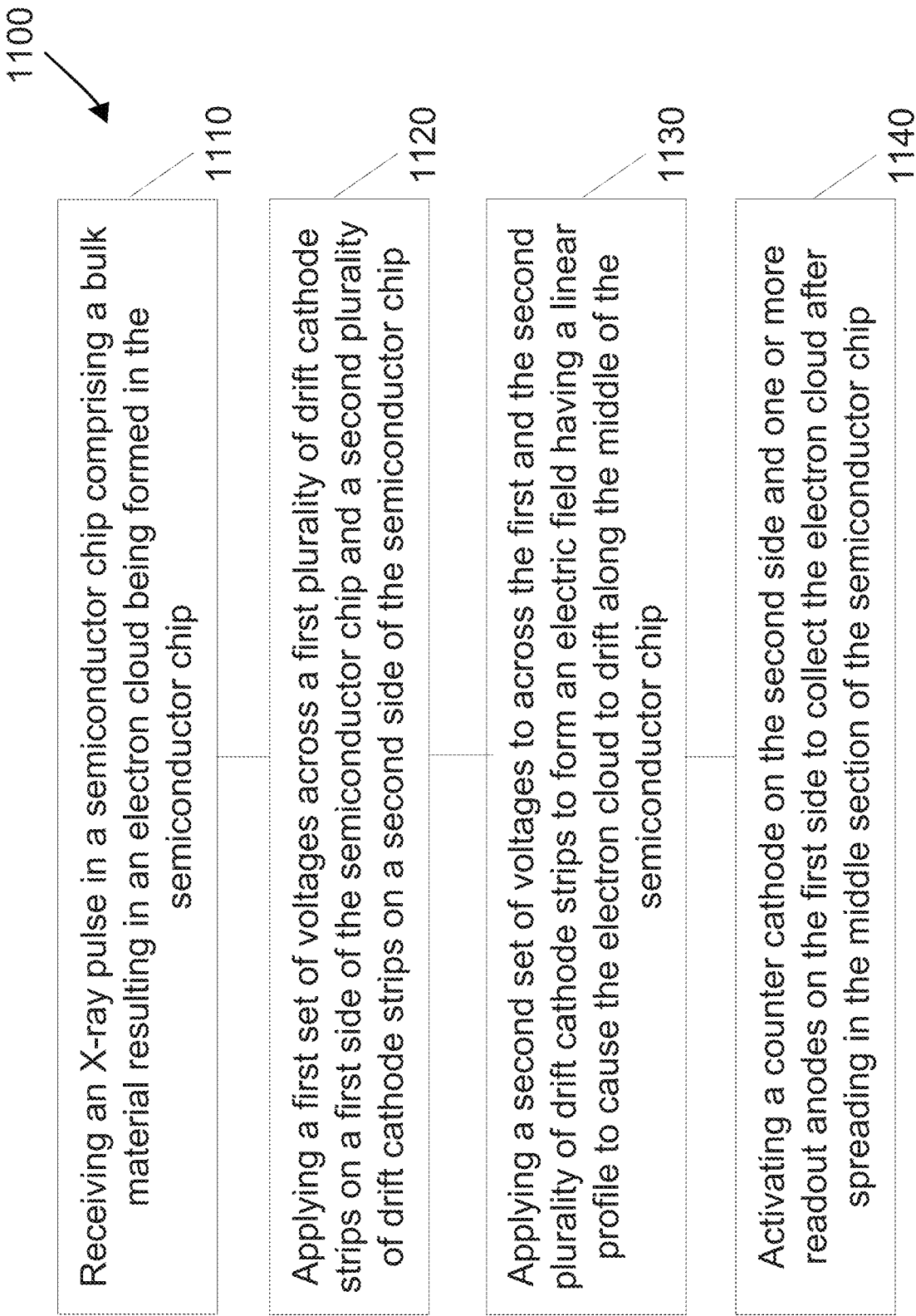
FIG. 11 illustrates a flowchart of a method for solid-state X-ray pulse detection with high temporal resolution.

FIG. 11 illustrates a flowchart of a method 1100 for solid-state X-ray pulse detection with high temporal resolution. The method 1100 includes, at operation 1110, receiving an X-ray pulse in a semiconductor chip comprising a bulk material resulting in an electron cloud being formed in the semiconductor chip.

The method 1100 includes, at operation 1120, applying a first set of voltages across a first plurality of drift cathode strips on a first side (or front) of the semiconductor chip and a second plurality of drift cathode strips on a second side (or back) of the semiconductor chip. In some embodiments, each of the first plurality and the second plurality of drift cathode strips are doped with a p-type dopant, and setting the first set of voltages causes the electron cloud to migrate to a middle section of the semiconductor chip.

The method 1100 includes, at operation 1130, applying a second set of voltages to across the first and the second plurality of drift cathode strips to form an electric field having a linear profile to cause the electron cloud to drift along the middle of the semiconductor chip.

The method 1100 includes, at operation 1140, activating a counter cathode on the second side and one or more readout anodes on the first side to collect the electron cloud after spreading in the middle section of the semiconductor chip. In some embodiments, each of the readout anodes is doped with an n-type dopant.

In some embodiments, the bulk material comprises silicon, and the p-type dopant is boron and the n-type dopant is phosphorous.

In some embodiments, the p-type and n-type dopant concentrations are $1\times10^{15}/cm^2$.

In some embodiments, the method 1100 further comprises the operation of generating, using an X-ray source, the X-ray pulse.

In some embodiments, the method 1100 further comprises the operation of selecting a thickness of the semiconductor chip, a number of the first plurality and the second plurality of drift cathode strips, and a bias voltage applied to the first plurality and the second plurality of drift cathode strips to obtain a predetermined temporal resolution for X-ray pulses within a particular range of energies.

Embodiments of the disclosed technology include a system for solid-state X-ray pulse detection with high temporal resolution. In an example, the system includes a semiconductor chip comprising a bulk material, a first plurality of drift cathode strips on a first side (or front) of the semiconductor chip, a second plurality of drift cathode strips on a second side (or back) of the semiconductor chip, wherein each of the first plurality and the second plurality of drift cathode strips are doped with a p-type dopant, one or more readout anodes positioned on the first side, wherein each of the readout anodes is doped with an n-type dopant, and a counter cathode positioned on the second side, wherein the first plurality and the second plurality of drift cathode strips are configured to create a potential well in a middle section of the semiconductor chip and cause an electron cloud, generated by an X-ray pulse being incident on the semiconductor chip, to drift in a first direction towards the middle section of the semiconductor chip, wherein the first and the second plurality of drift cathodes are configured to further create a linearly graded potential along a length of the semiconductor chip and to cause the electron cloud to drift in a second direction that is substantially perpendicular to the first direction, and wherein the plurality of readout anodes are configured to collect the electron cloud after its spreading in the middle section of the semiconductor chip.

In some embodiments, the system further comprises a voltage divider network comprising a serpentine structure, wherein creating the linearly graded potential is further based on the voltage divider network.

In some embodiments, the system further comprises a guard ring surrounding the semiconductor ship to prevent stray leakage from outside the semiconductor chip from interfering with the electron cloud.

In some embodiments, the system further comprises a first guard strip, parallel and adjacent to the plurality of readout anodes, to prevent a leakage current from being read by the plurality of readout anodes, and a second guard strip, parallel and adjacent to a last drift cathode strip on a second edge opposite from the first edge, to prevent electronic coupling between the guard ring and the last drift cathode strip.

In some embodiments, the bulk material comprises silicon, and wherein the p-type dopant is boron and the n-type dopant is phosphorous.

In some embodiments, the p-type and n-type dopant concentrations are $1\times10^{15}/cm^2$.

In some embodiments, the bulk material comprises germanium.

In some embodiments, the system further comprises an X-ray source to generate the X-ray pulse that is incident on the semiconductor chip.

In some embodiments, values for a thickness of the semiconductor device, a number of the first plurality and the second plurality of drift cathode strips, and a bias voltage applied to the first and the second plurality of drift cathode strips are selected to obtain a predetermined temporal resolution for X-ray pulses within a particular range of energies.

In some embodiments, the values are selected based on a physics-based model that describes a drift velocity of the electron cloud for varying values of the bias voltage.

In some embodiments, the physics-based model further describes a drift time limit for varying values of the thickness of the semiconductor chip.

Figure 12:
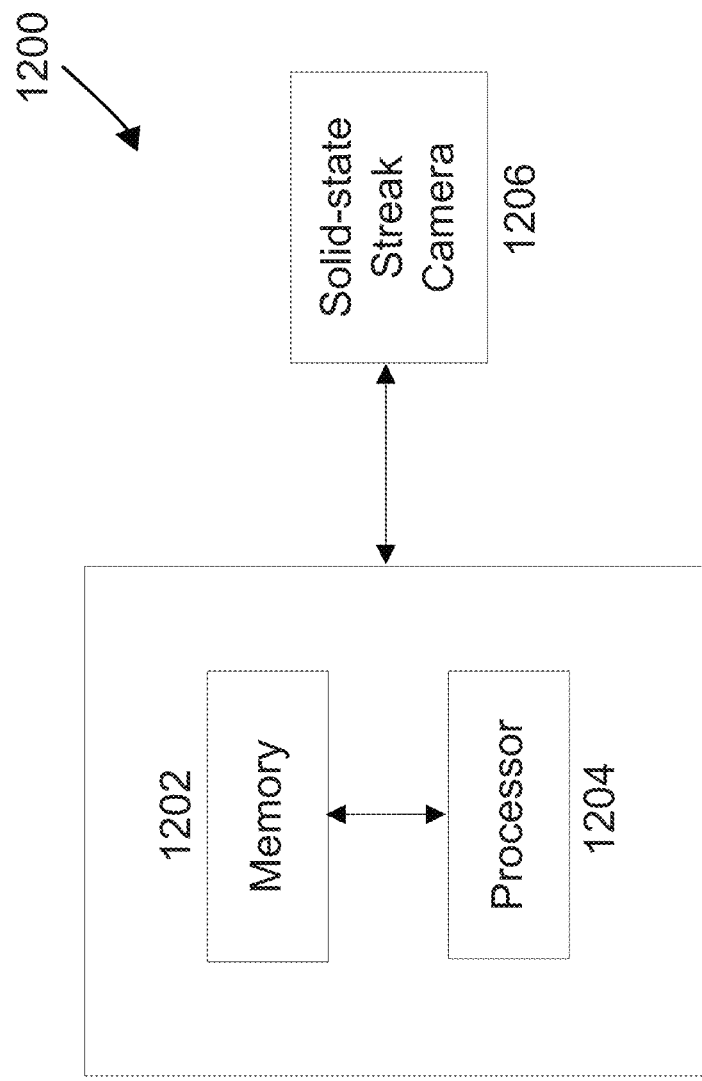
FIG. 12 illustrates an example of an apparatus that can implement methods and techniques for solid-state X-ray pulse detection with high temporal resolution.

FIG. 12 is a notional block diagram of an example hardware apparatus (which includes the illustrated electrical and processing hardware and optical hardware that is not shown in FIG. 12) that can accommodate at least some of the disclosed technology. The apparatus 1200 may be implemented in a fixed or mobile framework to enable solid-state X-ray pulse detection with high temporal resolution in both the laboratory and in the field. The apparatus 1200 may include one or more processors 1202, one or more memories 1204 and a solid-state streak camera (or detector) 1206. The processor(s) 1202 may be configured to implement one or more methods (including, but not limited to, method 1200) described in the present document. The memory (memories) 1204 may be used for storing data and code used for implementing the methods and techniques described herein. The solid-state streak detector 1206 is coupled to the processor 1202 and/or the memory 1204 and can receive commands and signals from the processor; the solid-state streak detector 1206 may also transmit signals including data and commands to the processor 1202 and/or memory 1204.

Implementations of the subject matter and the functional operations described in this patent document can be implemented in various systems, optical components, digital electronic circuitry, or in computer software, firmware, or hardware, including the structures disclosed in this specification and their structural equivalents, or in combinations of one or more of them.

Part of the disclosed subject matter in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An X-ray pulse detection system, comprising:
 a semiconductor chip comprising a bulk material;
 a first plurality of drift cathode strips on a first side of the semiconductor chip;
 a second plurality of drift cathode strips on a second side of the semiconductor chip, wherein each of the first plurality and the second plurality of drift cathode strips are doped with a p-type dopant;
 a plurality of readout anodes positioned on the first side, wherein each of the plurality of readout anodes is doped with an n-type dopant; and
 a counter cathode positioned on the second side,
 wherein the first plurality and the second plurality of drift cathode strips are configured to create a potential well in a middle section of the semiconductor chip and cause an electron cloud, generated by an X-ray pulse being incident on the semiconductor chip, to drift in a first direction towards the middle section of the semiconductor chip, wherein the first and the second plurality of drift cathodes are configured to further create a linearly graded potential along a length of the semiconductor chip and to cause the electron cloud to drift in a second direction that is substantially perpendicular to the first direction, wherein the plurality of readout anodes are configured to collect the electron cloud after its spreading in the middle section of the semiconductor chip, and wherein values for a thickness of the semiconductor chip, a number of the first plurality and the second plurality of drift cathode strips, and a bias voltage applied to the first and the second plurality of drift cathode strips are selected to obtain a predetermined temporal resolution for X-ray pulses within a particular range of energies, wherein a value for the thickness of the semiconductor chip is selected from a range spanning 0.01 µm to 1000 µm, wherein a value of the number of the first plurality and the second plurality of drift cathode strips is selected from a range spanning 1 to 50, wherein a value for the bias voltage is selected from a range spanning 0V to 12V, and wherein the particular range of energies spans 1 keV to 1000 keV.

2. The X-ray pulse detection system of claim 1, further comprising:
a voltage divider network comprising a serpentine structure, wherein creating the linearly graded potential is further based on the voltage divider network.

3. The X-ray pulse detection system of claim 1, further comprising:
a guard ring surrounding the semiconductor chip to prevent stray leakage from outside the semiconductor chip from interfering with the electron cloud.

4. The X-ray pulse detection system of claim 3, further comprising:
a first guard strip, parallel and adjacent to the plurality of readout anodes on a first edge, to prevent a leakage current from being read by the plurality of readout anodes; and
a second guard strip, parallel and adjacent to a last drift cathode strip on a second edge opposite from the first edge, to prevent electronic coupling between the guard ring and the last drift cathode strip.

5. The X-ray pulse detection system of claim 1, wherein the bulk material comprises silicon, and wherein the p-type dopant is boron and the n-type dopant is phosphorous.

6. The X-ray pulse detection system of claim 1, wherein the bulk material comprises germanium.

7. The X-ray pulse detection system of claim 1, further comprising:
an X-ray source to generate the X-ray pulse that is incident on the semiconductor chip.

8. The X-ray pulse detection system of claim 1, wherein the values are selected based on a physics-based model that describes a drift velocity of the electron cloud for varying values of the bias voltage.

9. The X-ray pulse detection system of claim 8, wherein the physics-based model further describes a drift time limit for varying values of the thickness of the semiconductor chip.

10. A device chip for solid-state X-ray detection, comprising:
a series of boron-doped drift cathode strips mirrored on a front and a back of the device chip;
a column of phosphorus-doped readout anodes on the front of the device chip; and
a boron-doped counter cathode on the back of the device chip,
wherein values for a thickness of the device chip, a number of the series of boron-doped drift cathode strips mirrored on the front and the back of the device chip, and a bias voltage applied to the series of boron-doped drift cathode strips are selected to obtain a predetermined temporal resolution for X-ray pulses within a particular range of energies, wherein a value for the thickness of the device chip is selected from a range spanning 0.01 µm to 1000 µm, wherein a value of the number of the series of boron-doped drift cathode strips is selected from a range spanning 1 to 50, wherein a value for the bias voltage is selected from a range spanning 0V to 12V, and wherein the particular range of energies spans 1 keV to 1000 keV.

11. The device chip of claim 10, wherein the device chip is configured to spread a charge generated by a 25 ns X-ray pulse and achieve a 30 µm spatial resolution and a 30 ps temporal resolution.

12. The device chip of claim 11, further comprising:
one or more charge integrating amplifiers coupled to the column of phosphorous-doped readout anodes.

13. A method for solid-state X-ray detection with a high temporal resolution, comprising:
receiving an X-ray pulse in a semiconductor chip comprising a bulk material resulting in an electron cloud being formed in the semiconductor chip;
applying a first set of voltages across a first plurality of drift cathode strips on a first side of the semiconductor chip and a second plurality of drift cathode strips on a second side of the semiconductor chip, wherein each of the first plurality and the second plurality of drift cathode strips are doped with a p-type dopant, and wherein setting the first set of voltages causes the electron cloud to migrate to a middle section of the semiconductor chip;
applying a second set of voltages to across the first and the second plurality of drift cathode strips to form an electric field having a linear profile to cause the electron cloud to drift along the middle of the semiconductor chip; and
activating a counter cathode on the second side and one or more readout anodes on the first side to collect the electron cloud after spreading in the middle section of the semiconductor chip, wherein each of the one or more readout anodes is doped with an n-type dopant,
wherein values for a thickness of the semiconductor chip, a number of the first plurality and the second plurality of drift cathode strips, and a bias voltage applied to the first and the second plurality of drift cathode strips are selected to obtain a predetermined temporal resolution for X-ray pulses within a particular range of energies, wherein a value for the thickness of the semiconductor chip is selected from a range spanning 0.01 µm to 1000 µm, wherein a value of the number of the first plurality and the second plurality of drift cathode strips is selected from a range spanning 1 to 50, wherein a value for the bias voltage is selected from a range spanning 0V to 12V, and wherein the particular range of energies spans 1 keV to 1000 keV.

14. The method of claim 13, wherein the bulk material comprises silicon, and wherein the p-type dopant is boron and the n-type dopant is phosphorous.

15. The method of claim 13, further comprising:
generating, using an X-ray source, the X-ray pulse.

16. The method of claim 13, further comprising:
selecting the thickness of the semiconductor chip, the number of the first plurality and the second plurality of drift cathode strips, and the bias voltage applied to the first plurality and the second plurality of drift cathode strips to obtain the predetermined temporal resolution for X-ray pulses within the particular range of energies.

17. The method of claim 13, wherein the bulk material comprises germanium.

* * * * *